(12) United States Patent
Li et al.

(10) Patent No.: US 12,004,291 B2
(45) Date of Patent: Jun. 4, 2024

(54) LENS MODULE OF REDUCED SIZE AND ELECTRONIC DEVICE HAVING THE LENS MODULE

(71) Applicant: TRIPLE WIN TECHNOLOGY(SHENZHEN) CO.LTD., Shenzhen (CN)

(72) Inventors: Yu-Shuai Li, Shenzhen (CN); Ding-Nan Huang, New Taipei (TW); Jing-Wei Li, Guangdong (CN); Jian-Chao Song, Guangdong (CN)

(73) Assignee: TRIPLE WIN TECHNOLOGY(SHENZHEN) CO. LTD., Shenzhen (CN)

( * ) Notice: Subject to any disclaimer, the term of this patent is extended or adjusted under 35 U.S.C. 154(b) by 355 days.

(21) Appl. No.: 17/582,477

(22) Filed: Jan. 24, 2022

(65) Prior Publication Data
US 2023/0128696 A1  Apr. 27, 2023

(30) Foreign Application Priority Data
Oct. 27, 2021 (CN) .......................... 202111256133.1

(51) Int. Cl.
| | |
|---|---|
| *H05K 1/18* | (2006.01) |
| *G02B 7/00* | (2021.01) |
| *G02B 7/02* | (2021.01) |
| *H05K 1/02* | (2006.01) |

(52) U.S. Cl.
CPC ........... *H05K 1/0274* (2013.01); *G02B 7/006* (2013.01); *G02B 7/02* (2013.01); *H05K 1/028* (2013.01); *H05K 2201/10121* (2013.01); *H05K 2201/10151* (2013.01)

(58) Field of Classification Search
CPC ................. H05K 1/0274; H05K 1/028; H05K 2201/10121; H05K 2201/10151; G02B 7/006; G02B 7/02
USPC ........................................................ 361/749
See application file for complete search history.

(56) References Cited

U.S. PATENT DOCUMENTS

| | | | |
|---|---|---|---|
| 2019/0288022 A1* | 9/2019 | Hsu ........................ | G02B 7/028 |
| 2020/0292778 A1* | 9/2020 | Li .......................... | G02B 7/021 |

FOREIGN PATENT DOCUMENTS

TW          202033986 A       9/2020

\* cited by examiner

*Primary Examiner* — Binh B Tran
(74) *Attorney, Agent, or Firm* — ScienBiziP, P.C.

(57) ABSTRACT

A lens module of reduced size includes a base and an adhesive body. The base includes a first base portion and a second base portion located outside the first base portion. The first base portion is made of plastic and the second base portion is made of metal. The base further comprises a slot. The adhesive body is received in the slot and connects the first base portion and the second base portion. The disclosure also provides an electronic device having the lens module.

18 Claims, 6 Drawing Sheets

LENS MODULE OF REDUCED SIZE AND ELECTRONIC DEVICE HAVING THE LENS MODULE

FIELD

The subject matter herein generally relates to imaging devices, and more particularly, to a lens module and an electronic device having the lens module.

BACKGROUND

Many electronic devices, such as mobile phones or tablet computers, have lens module. Such a lens module may include a lens, an optical filter, a plastic base, a photosensitive chip, a circuit board, and electronic components mounted on the circuit board. In order to improve the strength of the plastic base, a thickness of sidewalls of the plastic base is at least 0.3 mm. In addition, the lateral size of the plastic base also needs to increase to keep the bottom of the plastic base away from the heat-emitting electronic components of the circuit board, which increases the total size of the lens module.

BRIEF DESCRIPTION OF THE DRAWINGS

Implementations of the present disclosure will now be described, by way of embodiments, with reference to the attached figures.

DETAILED DESCRIPTION

Figure 1:
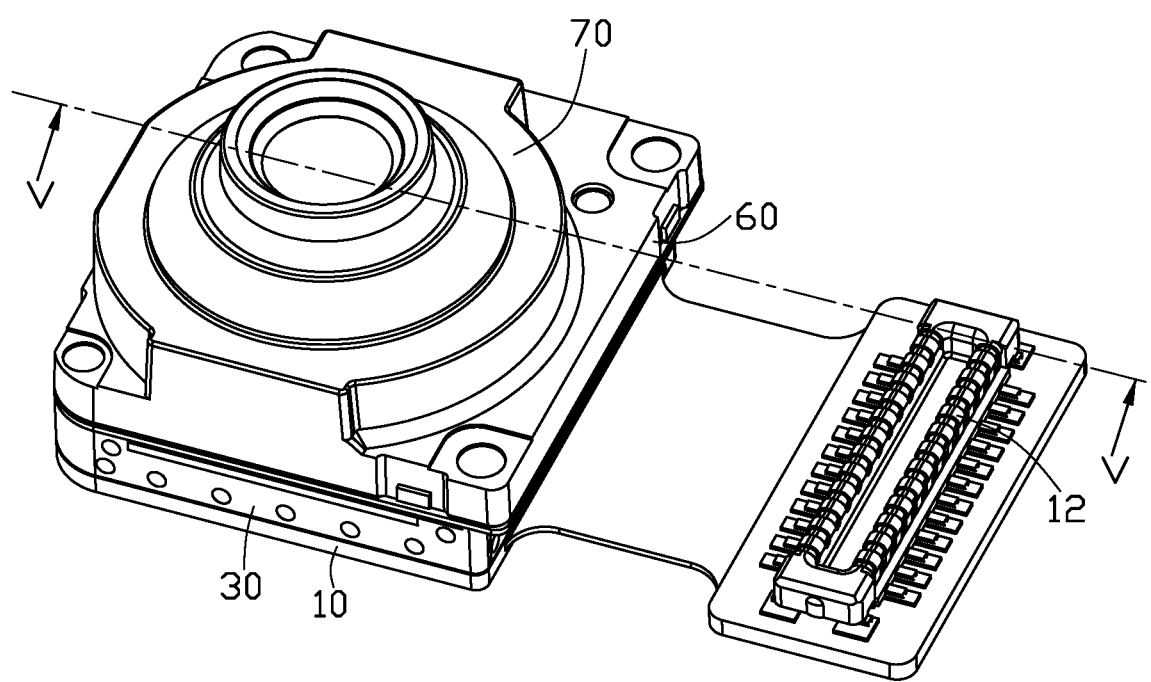
FIG. 1 is a diagrammatic view of an embodiment of a lens module according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Figure 2:
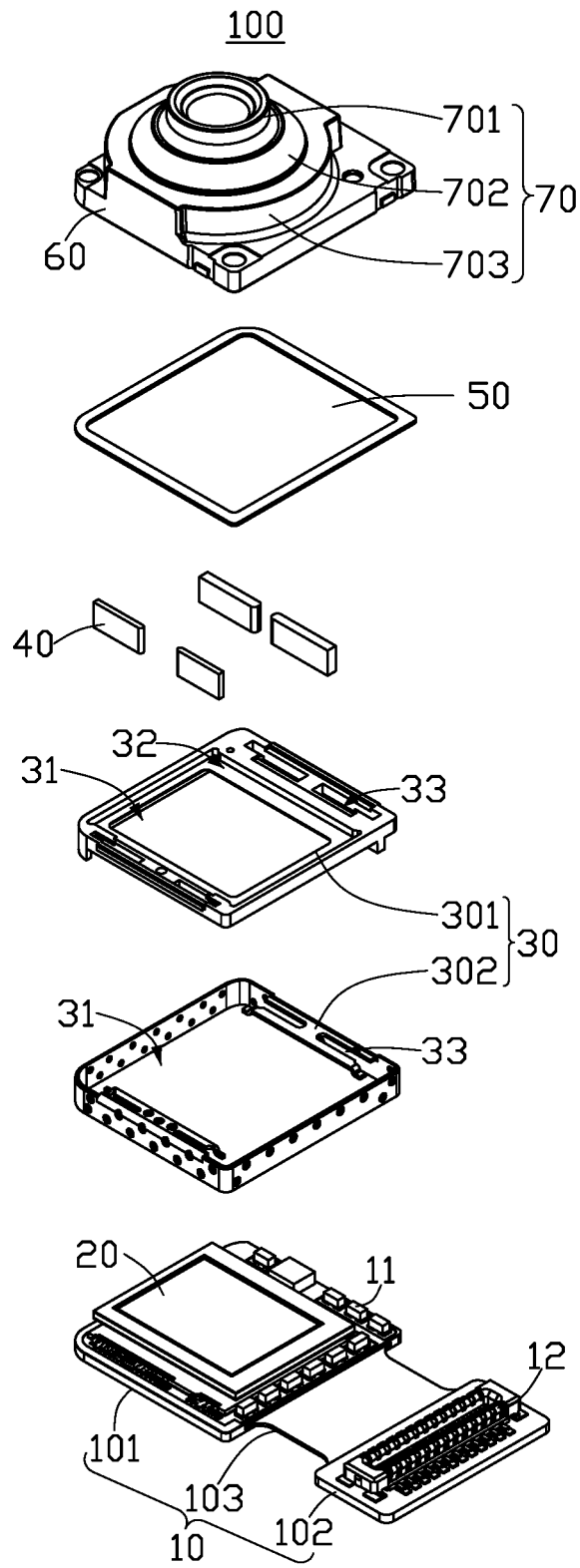
FIG. 2 is an exploded, diagrammatic view of the lens module of FIG. 1.

FIGS. 1 and 2 illustrate a lens module 100 in one embodiment. The lens module 100 includes a circuit board 10, a photosensitive chip 20, a base 30, at least one adhesive body 40, an optical filter 50, a holder 60, and a lens 70.

In at least one embodiment, the circuit board 10 may be a flexible circuit board, a rigid circuit board, or a rigid-flexible circuit board. In an embodiment, the circuit board 10 is a rigid-flexible circuit board, including a first rigid portion 101, a second rigid portion 102, and a flexible portion 103 between the first rigid portion 101 and the second rigid portion 102.

Figure 3:
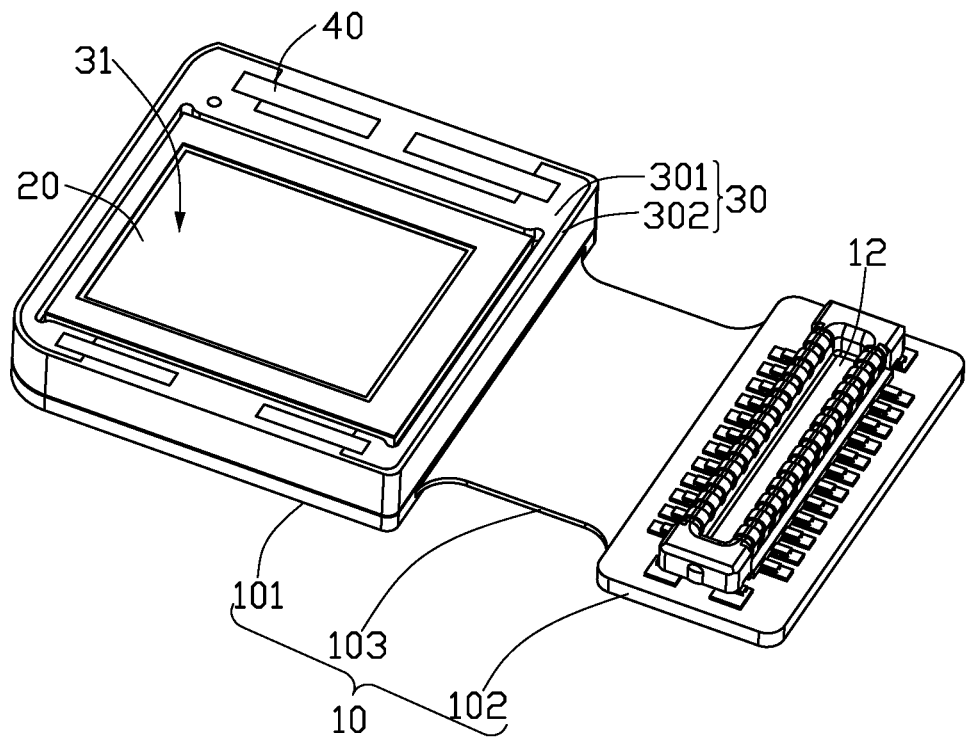
FIG. 3 is a partial, diagrammatic view of the lens module of FIG. 1.
Figure 4:
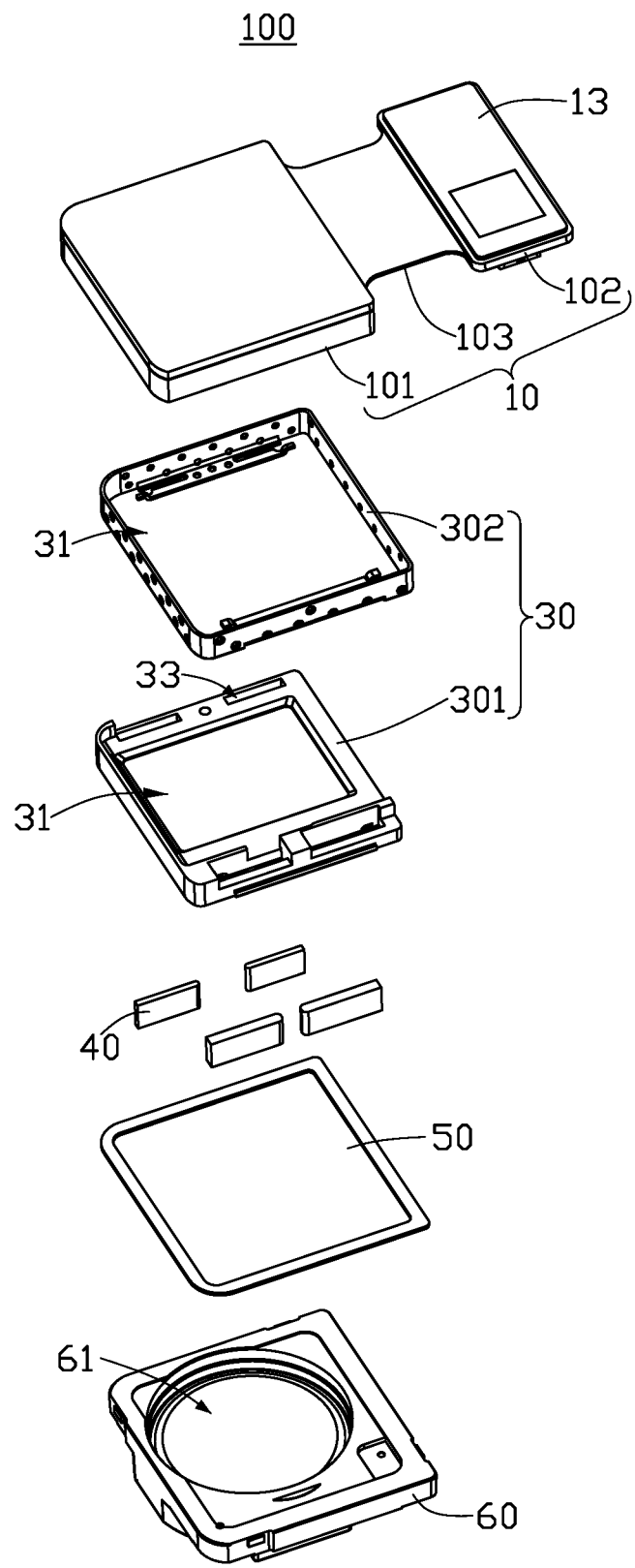
FIG. 4 is an exploded, diagrammatic view of the lens module of FIG. 1, from another angle.

Referring to FIGS. 3 and 4, a plurality of electronic components 11 are mounted on a surface of the first rigid portion 101. The electronic components 11 may include resistors, capacitors, diodes, triodes, relays, and electrically erasable programmable read-only memory (EEPROM). A connecting element 12 is mounted on a surface of the second rigid portion 102. In at least one embodiment, the plurality of electronic components 11 and the connecting element 12 may be mounted on a same surface of the circuit board 10. When the lens module 100 is installed in an electronic device 200 (shown in FIG. 6), the connecting element 12 transmits signals between the lens module 100 and other components of the electronic device 200. In at least one embodiment, the connecting element 12 may be a connector or gold fingers. A reinforcing board 13 is mounted on a surface of the second rigid portion 102. The reinforcing board 13 and the connecting element 12 may be mounted on opposite surfaces of the second rigid portion 102. In at least one embodiment, the reinforcing board 13 may be made of metal, such as stainless steel. The reinforcing board 13 reinforces mechanical strength of the second rigid portion 102.

The photosensitive chip 20 is mounted on the surface of the first rigid portion 101. The photosensitive chip 20 is electrically connected to the electronic components 11 through a wire 21 (shown in FIG. 5), to connect the photosensitive chip 20 to the circuit board 10.

The base 30 is mounted on the surface of the first rigid portion 101. In an embodiment, the photosensitive chip 20 and the connecting element 12 may be mounted on a same surface of the circuit board 10. In at least one embodiment, the base 30 may be rectangular. The base 30 includes a through hole 31 passing through the base 30. The base 30 further includes a groove 32. The base 30 further includes a surface away from the circuit board 10 and a portion of the surface surrounding the through hole 31 is recessed inwardly to form the groove 32.

Figure 5:
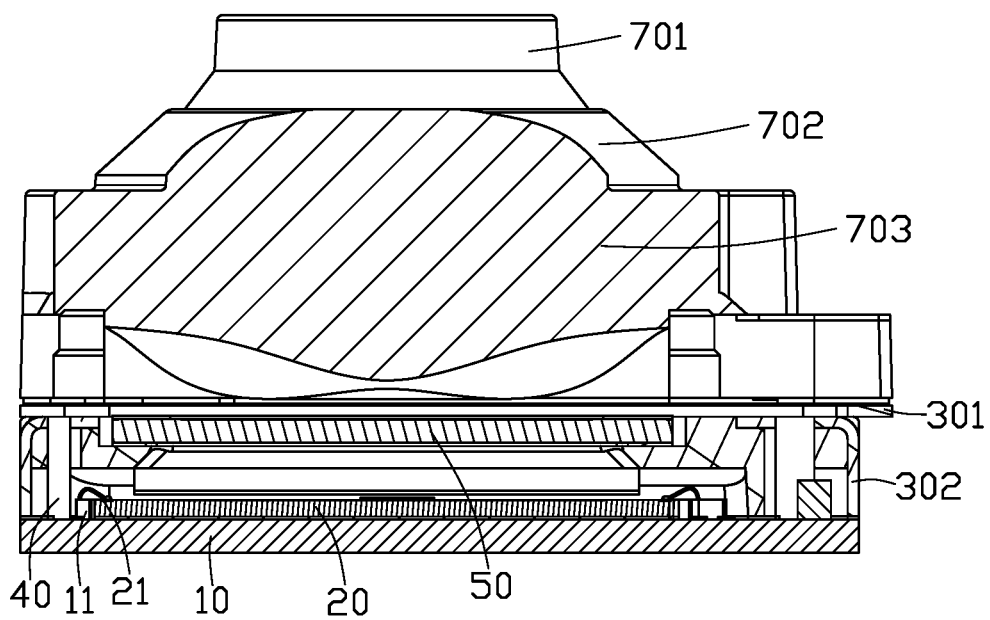
FIG. 5 is a cross-sectional view taken along V-V of FIG. 1.

Referring to FIGS. 3 and 5, the base 30 further includes a first base portion 301 and a second base portion 302 located outside the first base portion 301. That is, the second base portion 302 is an outer side wall of the base 30, and the first base portion 301 is embedded in the second base portion 302. The first base portion 301 is made of plastic, the second base portion 302 is made of metal, such as stainless steel. The base 30 further includes at least one slot 33 passing through the first base portion 301 and the second base portion 302. The first base portion 301 and the second base portion 302 include the slot 33. FIG. 2 shows only four slots 33, two of them being opposite to the other two. The number and locations of the slot 33 can be changed as required.

The adhesive body 40 is received in the slot 33 and connects the first base portion 301 and the second base portion 302. Bonding force between the first base portion 301 and the second base portion 302 are improved, and strength and stability of the base 30 are improved. A number of the adhesive bodies 40 is equal to number of the slots 33. FIG. 2 shows only four adhesive bodies 40 as an example.

The optical filter 50 is received in the groove 32. The optical filter 50 faces the photosensitive chip 20. In at least one embodiment, the optical filter 50 may be rectangular.

The holder 60 is installed on the surface of the base 30 facing away from the circuit board 10. In at least one embodiment, the holder 60 may be rectangular. The holder 60 includes a receiving hole 61 passing through the holder 60. In at least one embodiment, the holder 60 may be made of metal or plastic.

Referring to FIG. 5, in at least one embodiment, the lens 70 is received in the receiving hole 61 of the holder 60. In at least one embodiment, the lens 70 includes a first lens portion 701, a second lens portion 702, and a third lens portion 703 arranged successively. In at least one embodiment, the first lens portion 701 and the second lens portion 702 are located completely outside the receiving hole 61, one part of the third lens portion 703 is located outside the holding hole 61, and the other part is in the receiving hole 61.

Figure 6:
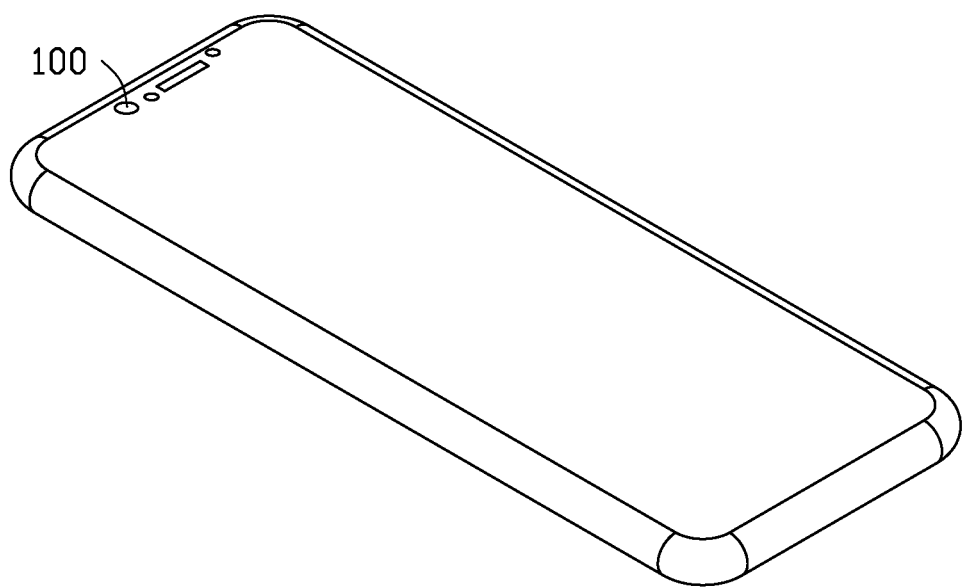
FIG. 6 is a diagrammatic view of an embodiment of an electronic device having the lens module of FIG. 1.

Referring to FIG. 6, the lens module 100 can be applied in an electronic device 200. The electronic device 200 can be a mobile phone, a laptop, a wearable device, a camera, a monitoring device, or other devices.

In the present disclosure, the base 30 includes the first base portion 301 and the second base portion 302 located outside the first base portion 301, the second base portion 302 is an outer side wall of the base 30. The second base portion 302 being made of high-strength metal, the thickness of the base 30 is reduced according to the present disclosure, compared with the existing technology of plastic base. Namely, a lateral size of the base 30 can be reduced, which reduces total overall size of the lens module 100.

In addition, in the present disclosure, the base 30 includes the at least one slot 33, and the adhesive body 40 is received in the slot 33 to connect the first base portion 301 and the second base portion 302 together. Strength and stability of the base 30 and the lens module 100 are thus improved. The adhesive body 40 being received in the slot 33 avoids the problems of navigating around electronic components and plastic molding.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A lens module, comprising:
a base comprising a first base portion and a second base portion located outside the first base portion, wherein the first base portion is made of plastic, the second base portion is made of metal, the base further comprises a slot; and
an adhesive body received in the slot and connected the first base portion and the second base portion.

2. The lens module of claim 1, wherein each of the first base portion and the second base portion comprises the slot.

3. The lens module of claim 1, wherein the lens module further comprises a circuit board, a plurality of electronic components is mounted on a surface of the circuit board, and the base is mounted on the surface of the circuit board having the electronic components.

4. The lens module of claim 3, wherein the circuit board comprises a first rigid portion, a second rigid portion, and a flexible portion connecting between the first rigid portion and the second rigid portion, and an connecting element is mounted on a surface of the second rigid portion.

5. The lens module of claim 4, further comprising a photosensitive chip, wherein the photosensitive chip is mounted on the surface of the circuit board having the electronic components.

6. The lens module of claim 5, further comprising an optical filter, wherein the base further comprises a groove, the optical filter is received in the groove and faces the photosensitive chip.

7. The lens module of claim 3, further comprising a holder and a lens, wherein the holder is installed on a surface of the base facing away from the circuit board, and the lens is received in the holder.

8. The lens module of claim 7, wherein the holder is rectangular, the holder comprises a receiving hole, and the lens is received in the receiving hole.

9. The lens module of claim 1, wherein the second base portion is made of stainless steel.

10. An electronic device, comprising:
a lens module, comprising:
a base comprising a first base portion and a second base portion located outside the first base portion, wherein the first base portion is made of plastic, the second base portion is made of metal, the base further comprises a slot; and
an adhesive body received in the slot and connected the first base portion and the second base portion.

11. The electronic device of claim 10, wherein each of the first base portion and the second base portion comprises the slot.

12. The electronic device of claim 10, wherein the lens module further comprises a circuit board, a plurality of electronic components is mounted on a surface of the circuit board, and the base is mounted on the surface of the circuit board having the electronic components.

13. The electronic device of claim 12, wherein the circuit board comprises a first rigid portion, a second rigid portion, and a flexible portion connecting between the first rigid portion and the second rigid portion, and an connecting element is mounted on a surface of the second rigid portion.

14. The electronic device of claim 13, further comprising a photosensitive chip, wherein the photosensitive chip is mounted on the surface of the circuit board having the electronic components.

15. The electronic device of claim 14, further comprising an optical filter, wherein the base further comprises a groove, the optical filter is received in the groove and faces the photosensitive chip.

16. The electronic device of claim 12, further comprising a holder and a lens, wherein the holder is installed on a surface of the base facing away from the circuit board, and the lens is received in the holder.

17. The electronic device of claim 16, wherein the holder is rectangular, the holder comprises a receiving hole, and the lens is received in the receiving hole.

18. The electronic device of claim 10, wherein the second base portion is made of stainless steel.

* * * * *